(12) United States Patent
Kim et al.

(10) Patent No.: US 8,987,836 B2
(45) Date of Patent: Mar. 24, 2015

(54) FIELD EFFECT TRANSISTOR HAVING FIN BASE AND AT LEASE ONE FIN PROTRUDING FROM FIN BASE

(71) Applicant: Samsung Electronics Co., Ltd., Suwon-Si, Gyeonggi-Do (KR)

(72) Inventors: Myeong-cheol Kim, Suwon-si (KR); Cheol Kim, Hwaseong-si (KR); Jaehun Seo, Suwon-si (KR); YooJung Lee, Yongin-si (KR); Kisoo Chang, Yongin-si (KR); Siyoung Choi, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 24 days.

(21) Appl. No.: 13/780,855

(22) Filed: Feb. 28, 2013

(65) Prior Publication Data
US 2013/0277720 A1    Oct. 24, 2013

(30) Foreign Application Priority Data

Apr. 23, 2012  (KR) ........................ 10-2012-0042194

(51) Int. Cl.
*H01L 29/78*    (2006.01)
*H01L 29/66*    (2006.01)
*H01L 21/336*   (2006.01)

(52) U.S. Cl.
CPC ........... *H01L 29/785* (2013.01); *H01L 29/7851* (2013.01)
USPC ................ 257/401; 257/288; 257/E29.137; 257/E21.442; 257/E21.409; 438/283

(58) Field of Classification Search
CPC ........... H01L 29/785; H01L 29/66795; H01L 21/845
USPC .......... 257/288, E29.137, E21.442, E21.409; 438/283

See application file for complete search history.

(56) References Cited

U.S. PATENT DOCUMENTS

| | | | |
|---|---|---|---|
| 7,323,374 B2 | 1/2008 | Beintner et al. | |
| 7,732,343 B2 | 6/2010 | Niroomand et al. | |
| 7,745,319 B2 | 6/2010 | Tang et al. | |
| 7,795,099 B2 | 9/2010 | Kang et al. | |
| 7,834,391 B2 | 11/2010 | Kang et al. | |
| 7,843,000 B2 | 11/2010 | Yu et al. | |
| 2006/0134868 A1* | 6/2006 | Yoon et al. ................ | 438/283 |
| 2007/0063276 A1 | 3/2007 | Beintner et al. | |

(Continued)

FOREIGN PATENT DOCUMENTS

| KR | 10-0560816 B1 | 3/2006 |
|---|---|---|
| KR | 2011-0076221 A | 7/2011 |

*Primary Examiner* — Su C Kim
*Assistant Examiner* — Regan J Rundio
(74) *Attorney, Agent, or Firm* — Harness, Dickey & Pierce, P.L.C.

(57) ABSTRACT

Field effect transistors including a source region and a drain region on a substrate, a fin base protruding from a top surface of the substrate, a plurality of fin portions extending upward from the fin base and connecting the source region with the drain region, a gate electrode on the fin portions, and a gate dielectric between the fin portions and the gate electrode may be provided. A top surface of the substrate may include a plurality of grooves (e.g., a plurality of convex portions and a plurality of concave portions). Further, a device isolation layer may be provided to expose upper portions of the plurality of fin portions and to cover top surfaces of the plurality of grooves.

19 Claims, 17 Drawing Sheets

(56) References Cited

U.S. PATENT DOCUMENTS

| | | |
|---|---|---|
| 2007/0065990 A1 | 3/2007 | Degroote et al. |
| 2007/0238299 A1 | 10/2007 | Niroomand et al. |
| 2008/0050885 A1 | 2/2008 | Tang et al. |
| 2008/0105931 A1 | 5/2008 | Kang et al. |
| 2008/0290379 A1 | 11/2008 | Chan et al. |
| 2009/0052251 A1 | 2/2009 | Kang et al. |
| 2009/0250769 A1 | 10/2009 | Yu et al. |
| 2010/0148234 A1* | 6/2010 | Torek et al. .................. 257/296 |
| 2010/0148300 A1 | 6/2010 | Zhou |
| 2011/0127610 A1* | 6/2011 | Lee et al. ..................... 257/365 |
| 2012/0049294 A1* | 3/2012 | Chen et al. .................. 257/401 |

* cited by examiner

FIELD EFFECT TRANSISTOR HAVING FIN BASE AND AT LEASE ONE FIN PROTRUDING FROM FIN BASE

CROSS-REFERENCE TO RELATED APPLICATIONS

This U.S. non-provisional patent application claims priority under 35 U.S.C. §119 to Korean Patent Application No. 10-2012-0042194, filed on Apr. 23, 2012, in the Korean Intellectual Property Office, the content of which is incorporated herein by reference in its entirety.

BACKGROUND OF THE INVENTION

Example embodiments relate to field effect transistors, and in particular, to fin field effect transistors.

Due to their small-size, multifunctionality, and/or low-cost characteristics, semiconductor devices are considered important elements in the electronic industry. The semiconductor devices can be generally classified into a memory device for storing data, a logic device for processing data, and a hybrid device including both of memory and logic elements. Due to the increased demand for electronic devices with a fast speed and/or a low power consumption, the semiconductor device requires a fast operating speed and/or a low operating voltage. To satisfy these technical requirements, the semiconductor device needs components with complex structure and is required to have an increased integration density.

SUMMARY

Example embodiments relate to field effect transistors, and in particular, to fin field effect transistors.

Example embodiments provide a field effect transistor with improved electric characteristics.

Other example embodiments provide a field effect transistor including a plurality of fin portions having the substantially same width.

According to example embodiments, a field effect transistor includes a source region and a drain region on a substrate, a fin base protruding from a top surface of the substrate, a plurality of fin portions extending upward from the fin base and connecting the source region with the drain region, a gate electrode on the plurality of fin portions, and a gate dielectric between the plurality of fin portions and the gate electrode.

In example embodiments, a thickness of the fin base may be greater than half a depth of a first trench between the plurality of fin portions.

In example embodiments, a top surface of the substrate may include a plurality of grooves adjacent to the fin base.

In example embodiments, the plurality of grooves may include a plurality of convex portions and a plurality of concave portions, and the plurality of convex portions may extend along an extending direction of the plurality of fin portions.

In example embodiments, the field effect transistor may further include at least one first trench between the plurality of fin portions. Top surfaces of the plurality of convex portions may be lower than a bottom surface of the at least one first trench.

In example embodiments, the field effect transistor may further include at least one first trench between the plurality of fin portions. Top surfaces of the plurality of convex portions may be higher than a bottom surface of the at least one first trench.

In example embodiments, the field effect transistor may further include a device isolation layer exposing upper portions of the plurality of fin portions and covering top surfaces of the plurality of grooves.

In example embodiments, the field effect transistor may further include at least one first trench between the plurality of fin portions. A top surface of the device isolation layer is higher than a bottom surface of the at least one first trench.

According to example embodiments, a field effect transistor may include at least one fin portion extending from a top surface of a substrate, a device isolation layer exposing an upper portion of the at least one fin portion, a gate electrode provided on and crossing the at least one fin portion, and a gate dielectric between the at least one fin portion and the gate electrode. The top surface of the substrate may include a plurality of grooves including a plurality of convex portions and a plurality of concave portions, and the plurality of convex portions extend parallel to the at least one fin portion.

In example embodiments, the device isolation layer may cover top surfaces of the plurality of convex portions.

In example embodiments, the at least one fin portion may include a plurality of fin portions spaced apart from each other by at least one first trench therebetween, and the field effect transistor may further include a fin base extending from the top surface of the substrate and connected to bottom surfaces of the plurality of the fin portions.

In example embodiments, a top surface of the fin base may be defined by a bottom surface of the at least one first trench, and the bottom surface of the at least one first trench may be higher than top surfaces of the plurality of convex portions.

In example embodiments, a top surface of the fin base may be defined by a bottom surface of the at least one first trench, and the bottom surface of the at least one first trench may be lower than top surfaces of the plurality of convex portions.

In example embodiments, the plurality of the fin portions may connect a source region with a drain region, and upper portions of the plurality of the fin portions may have a substantially same width as each other.

In example embodiments, the substrate may include a first region and a second region, and a number of the at least one fin portion in the first region may be different than a number of the at least one fin portion in the second region.

According to example embodiments, a field effect transistor includes a substrate having a substrate body and at least one fin portion extending away from a surface the substrate body, a source region and a drain region connected to each other via the at least one fin portion, a gate electrode over the at least one fin portion, and a gate dielectric between the at least one fin portion and the gate electrode.

In example embodiments, the at least one fin portion may include a plurality of fin portions having a same width and spaced apart from each other.

In example embodiments, the substrate body and the at least one fin may form a single (or, alternatively, integrally-formed) body.

In example embodiments, the at least one fin portion may include a plurality of fin portions.

In example embodiments, the plurality of fin portions may be symmetrical.

In example embodiments, the substrate may further include a plurality of grooves extending from the surface of the substrate body and parallel to the plurality of fin portions, and a fin base interposed between the substrate body and the plurality of fin portions. Either the plurality of grooves may extend above the fin base, or the fin base may extend above the plurality of grooves.

In example embodiments, a thickness of the fin base may be less than half a depth of a first trench between adjacent fin portions when the plurality of grooves extend above the fin base, or the thickness of the fin base may be greater than half the depth of the first trench when the fin base extends above the plurality of grooves.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
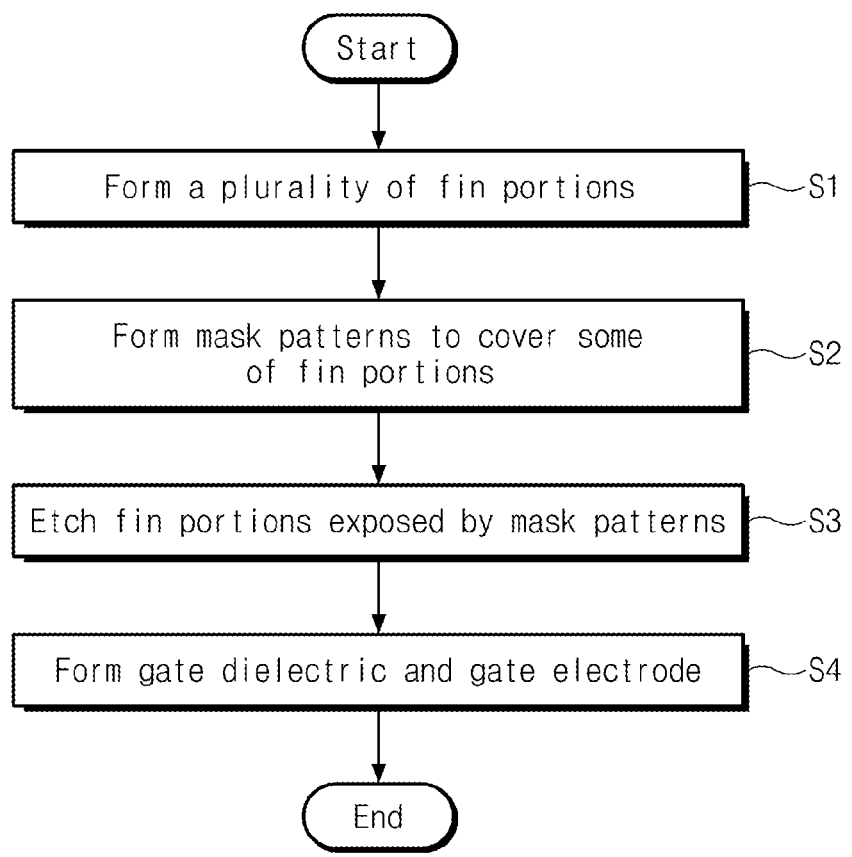
FIG. 1 is a flow chart illustrating a method of fabricating a field effect transistor according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., or the purpose of describing particular embodiments e like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments relate to field effect transistors, and in particular, to fin field effect transistors.

Figure 2:
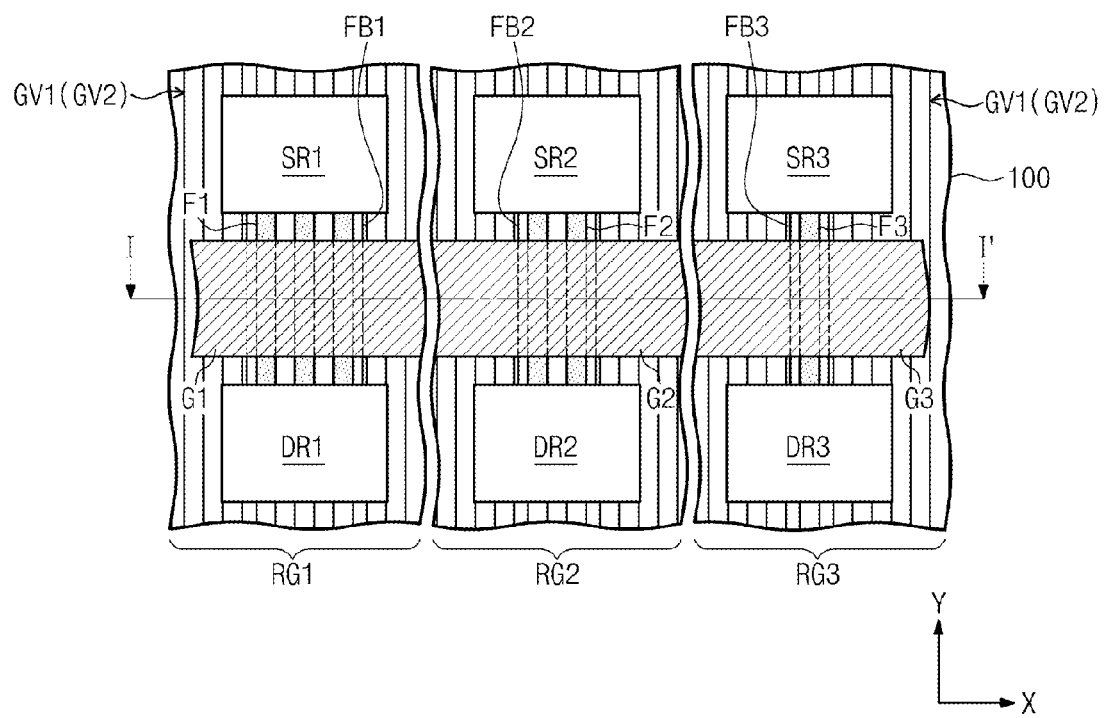
FIG. 2 is a plan view of a field effect transistor according to example embodiments.

FIG. 1 is a flow chart illustrating a method of fabricating a field effect transistor according to example embodiments. FIG. 2 is a plan view of a field effect transistor according to example embodiments. FIGS. 3 through 13 are sectional views taken along a line I-I' of FIG. 2 and show a method of fabricating a field effect transistor according to example embodiments.

Figure 3:
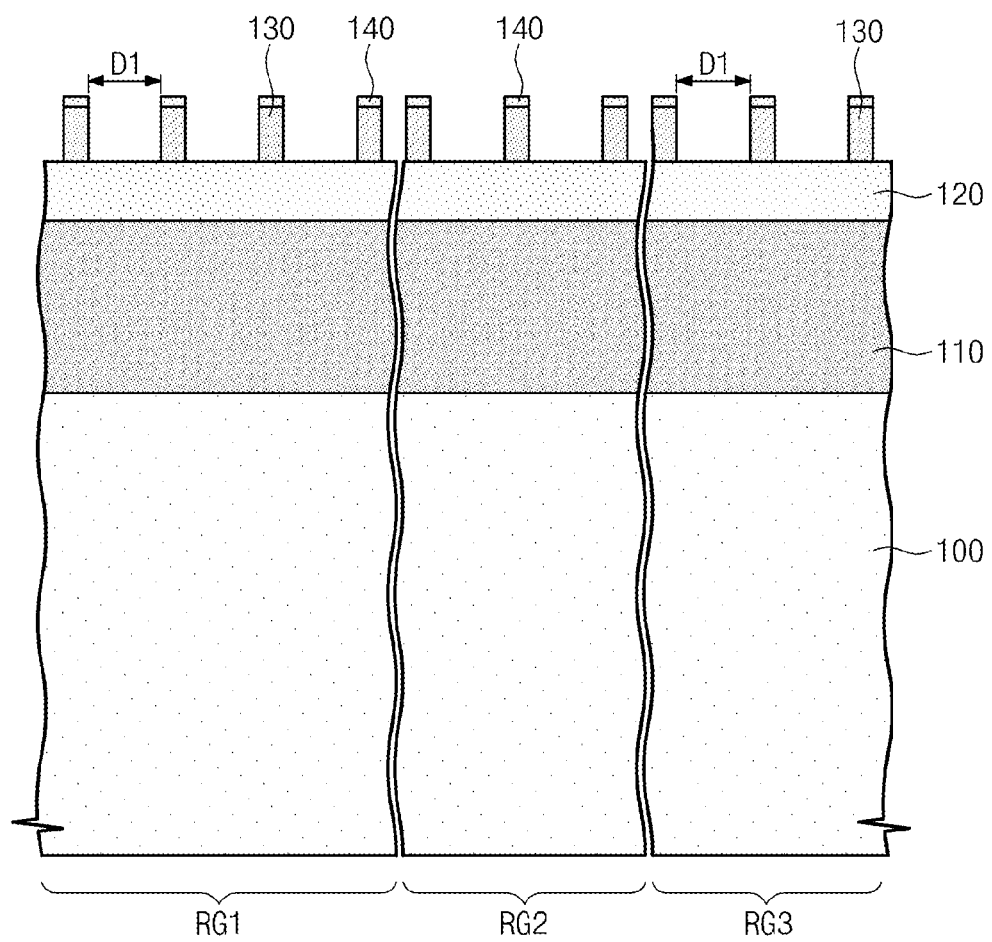
FIGS. 3 through 13 are sectional views taken along a line I-I' of FIG. 2 and show a method of fabricating a field effect transistor according to example embodiments.

Referring to FIGS. 2 and 3, a mask layer and a sacrificial patterns 130 may be sequentially formed on a substrate 100. The substrate 100 may be a semiconductor wafer including at least one of silicon, germanium, or silicon-germanium. The substrate 100 may include a first region RG1, a second region RG2, and a third region RG3. In example embodiments, transistors provided on the first to third regions RG1-RG3 may have different threshold voltages from each other.

For example, the mask layer may include a first mask layer 110 and a second mask layer 120. The first mask layer 110 may include a silicon nitride layer or a silicon oxynitride layer, and the second mask layer 120 may include a polysilicon layer. The sacrificial patterns 130 may be formed by patterning a sacrificial layer (not shown) using a third mask patterns 140 as an etch mask. In example embodiments, the sacrificial patterns 130 may include an amorphous carbon containing layer and/or an organic planarization layer (OPL). Each of the sacrificial patterns 130 may be shaped like a line extending along y-axis direction, and the sacrificial patterns 130 may have the substantially same width. In example embodiments, a distance D1 between the sacrificial patterns 130 may be the substantially same in all of the first to third regions RG1-RG3, but example embodiments may not be limited thereto.

Figure 4:
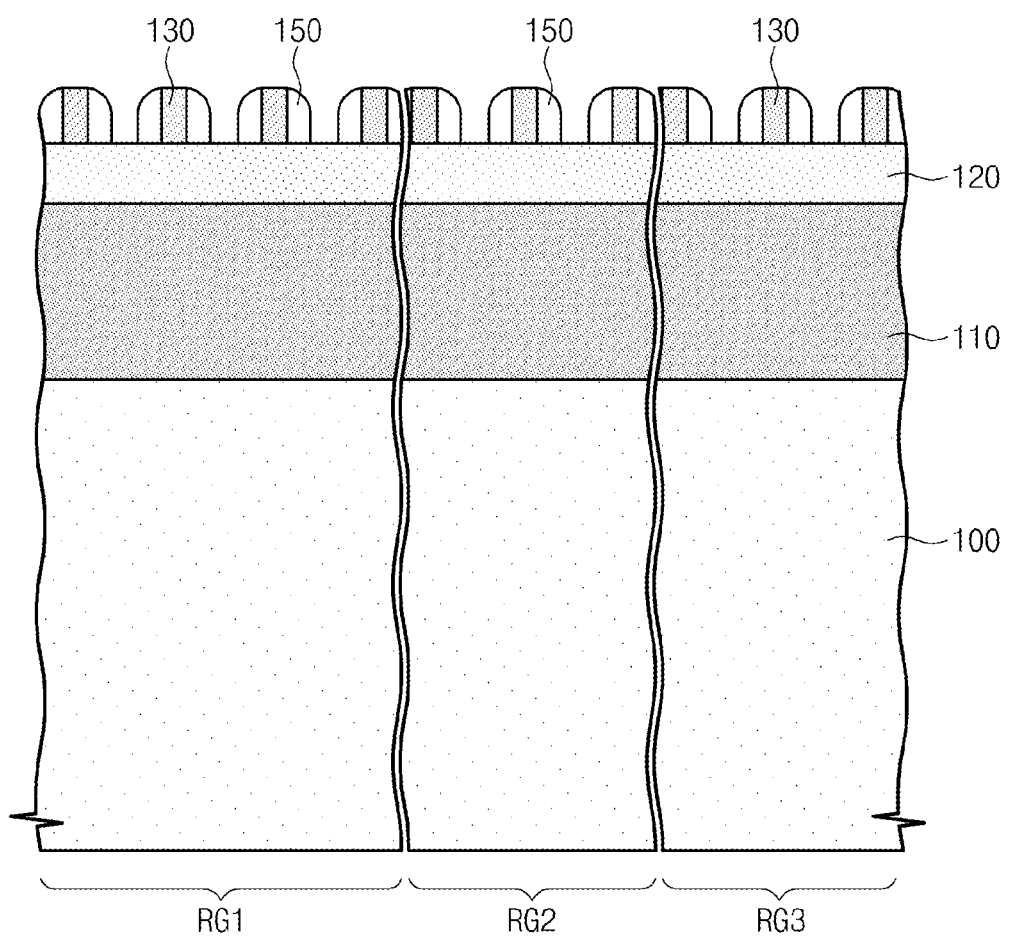

Referring to FIGS. 2 and 4, spacer mask patterns 150 may be formed on sidewalls of the sacrificial patterns 130. For example, the formation of the spacer mask patterns 150 may include forming an insulating layer to conformally cover the structure provided with the sacrificial patterns 130 and etching the insulating layer in a dry etching manner. The spacer mask patterns 150 may include at least one of a silicon oxide layer, a silicon oxynitride layer, or a silicon nitride layer. The spacer mask patterns 150 may be formed to expose top surfaces of the sacrificial patterns 130. Each of the first and second mask layers 110 and 120, the sacrificial patterns 130, and the spacer mask patterns 150 may be formed by a deposition technique, such as, a chemical vapor deposition (CVD), a physical vapor deposition (PVD), or an atomic layer deposition (ALD).

Figure 5:
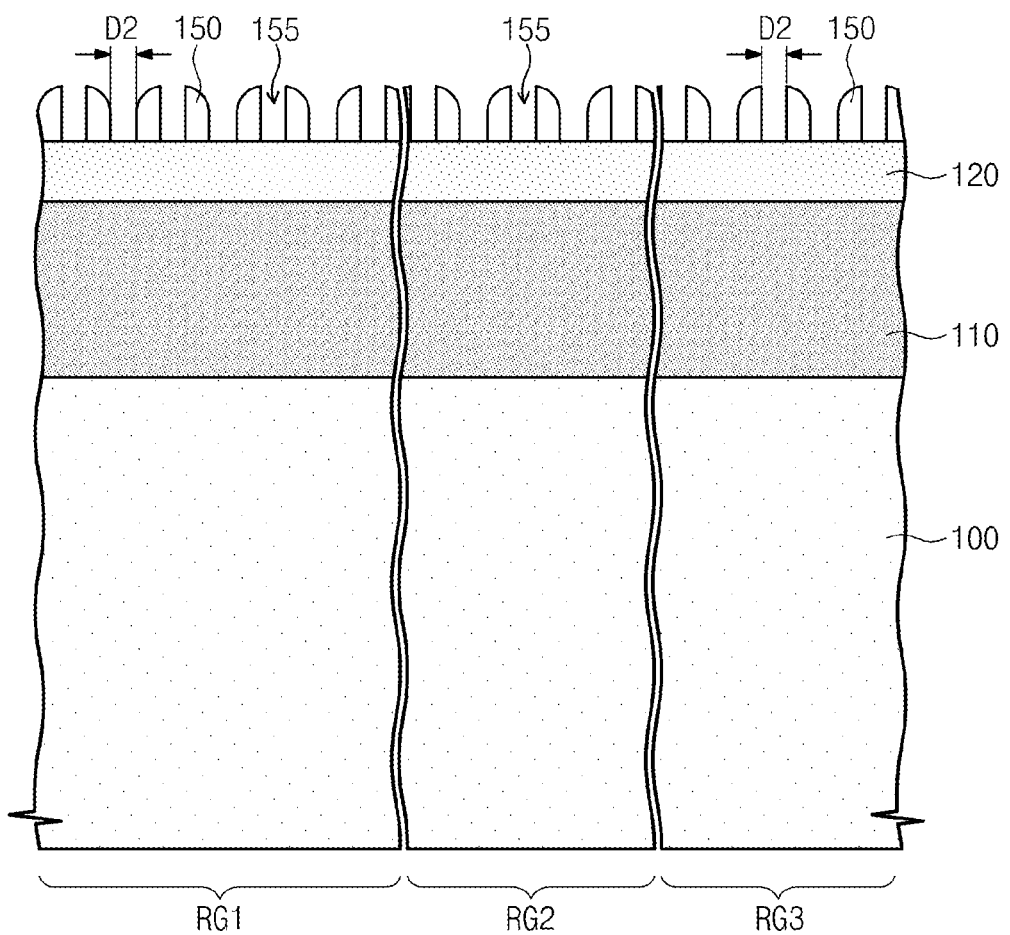

Referring to FIGS. 2 and 5, the sacrificial patterns 130 may be removed. The removal of the sacrificial patterns 130 may be performed using a selective etching process. As a result, a recess region 155 may be formed to expose a top surface of the second mask layer 120. The spacer mask patterns 150 may be arranged with the substantially same distance D2. The distance D2 between the spacer mask patterns 150 may be smaller than the distance D1 between the sacrificial patterns 130 shown in FIG. 3.

Figure 6:
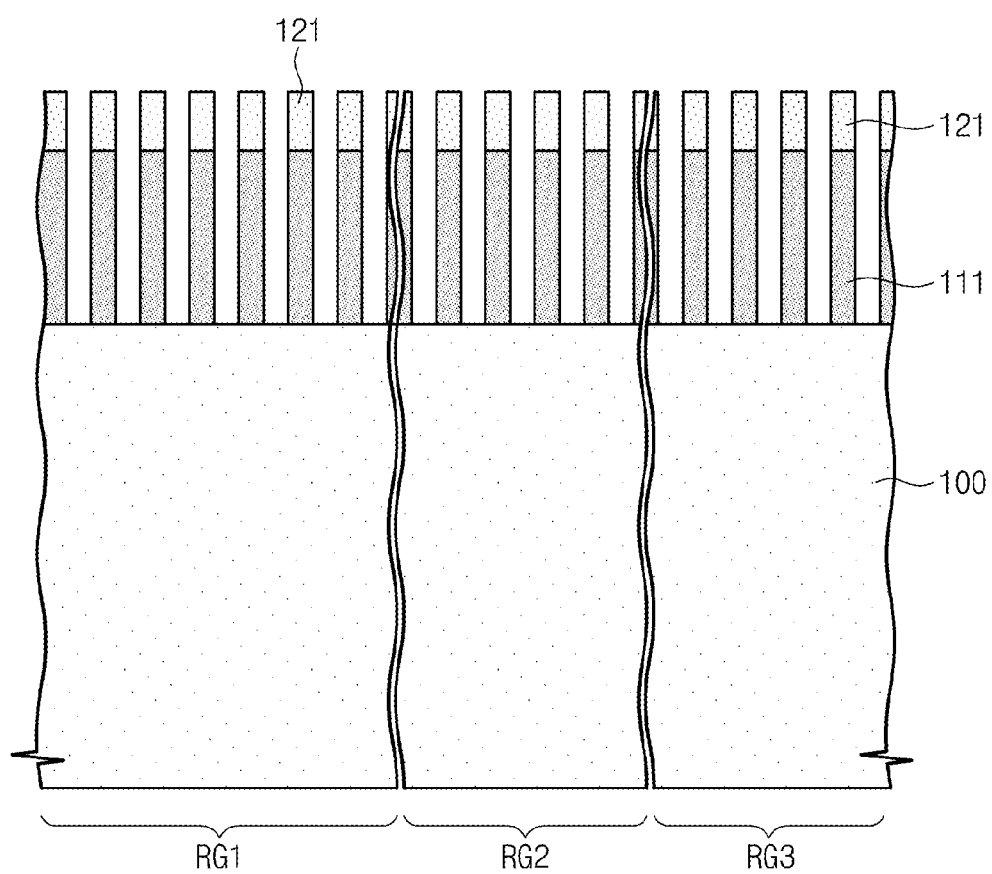

Referring to FIGS. 2 and 6, the first mask layer 110 and the second mask layer 120 may be patterned using the spacer mask patterns 150 as an etch mask to form first mask patterns 111 and second mask patterns 121. The patterning process may include an anisotropic etching process (e.g., a plasma etching process) or a reactive ion etching (RIE) process. The first mask patterns 111 may be formed to expose the top surface of the substrate 100.

Figure 7:
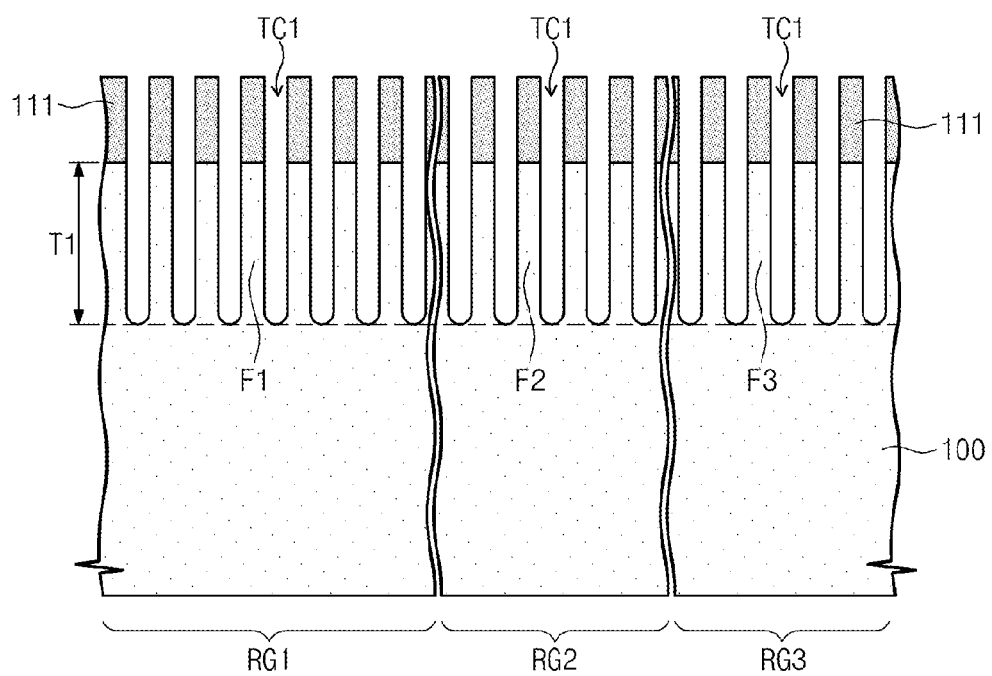

Referring to FIGS. 1, 2, and 7, the substrate 100 may be etched using the first and second mask patterns 111 and 121 as an etch mask to form a plurality of fin portions (in S1). The fin portions may include first fin portions F1 on the first region RG1, second fin portions F2 on the second region RG2, third fin portions F3 on the third region RG3. As the etching of the substrate 100, first trenches TC1 having a depth T1 may be formed to separate the first to third fin portions F1-F3 from each other. The second mask patterns 121 and/or upper portions of the first mask patterns 111 may be removed during the etching process of the substrate 100. The fin portions F1-F3 may have the substantially same width as each other.

Figure 8:
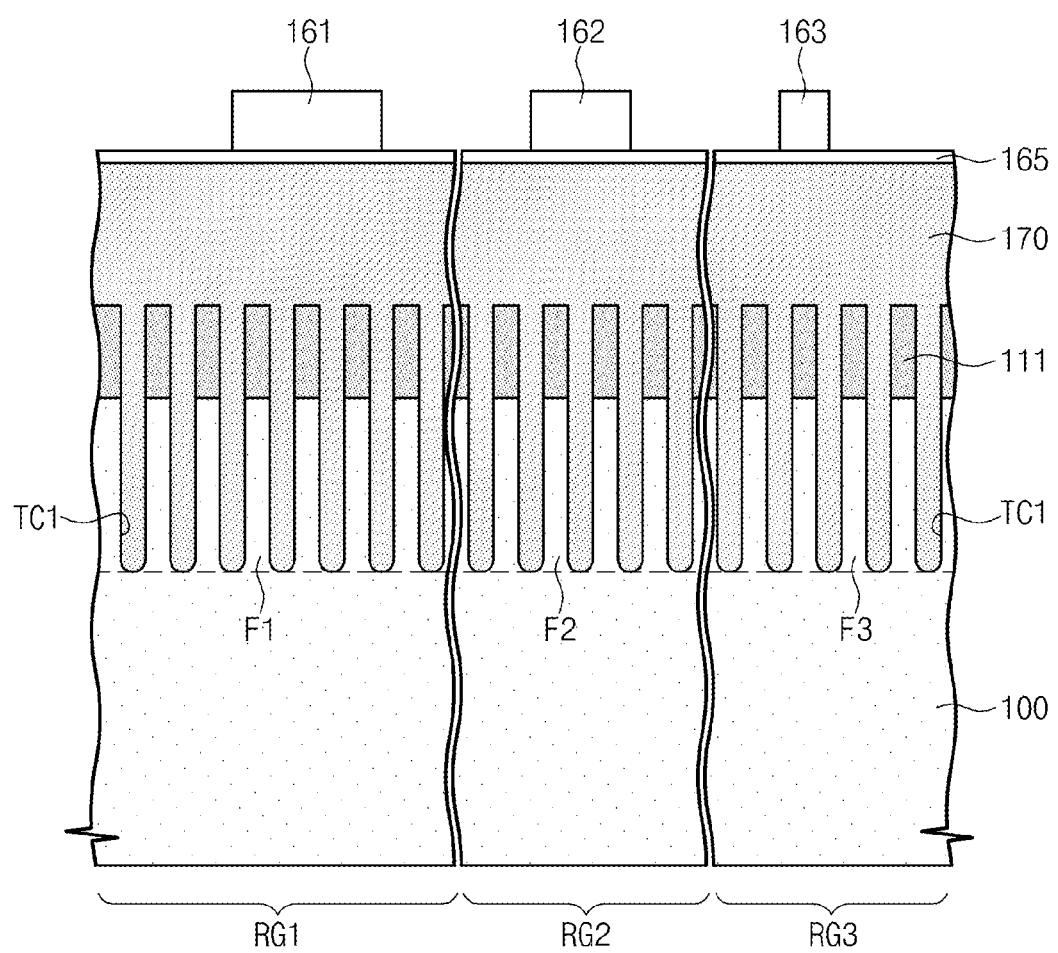

Referring to FIGS. 2 and 8, a block mask layer 170, a fourth mask layer 165, and fifth mask patterns 161-163 may be formed on the resultant structure provided with the fin portions F1-F3. The block mask layer 170 may include an amorphous carbon containing layer and/or an organic planarization layer (OPL). The block mask layer 170 may be formed to fill the first trenches TC1. The fourth mask layer 165 may include at least one of a silicon oxynitride layer, a silicon oxide layer, and a silicon nitride layer, and the fifth mask patterns 161-163 may include a photoresist layer. In example embodiments, the fifth mask patterns 161-163 may be formed on the first to third regions RG1-RG3, respectively, and have different widths from each other. For example, the fifth mask pattern 161 on the first region RG1 may be formed to cover three ones of the first fin portions F1, the fifth mask pattern 162 on the second region RG2 may be formed to cover two ones of the second fin portions F2, and the fifth mask pattern 162 on the third region RG3 may be formed to cover one of the third fin portions F3. However, example embodiments may not be limited to the aforementioned shapes of the fifth mask patterns 161-163. For example, the shapes of the fifth mask patterns 161-163 may be variously modified in consideration of several factors, such as use, size, and threshold voltage of the semiconductor device. For example, in other embodiments, the fifth mask patterns 161-163 may be formed to have the substantially same width.

Figure 9:
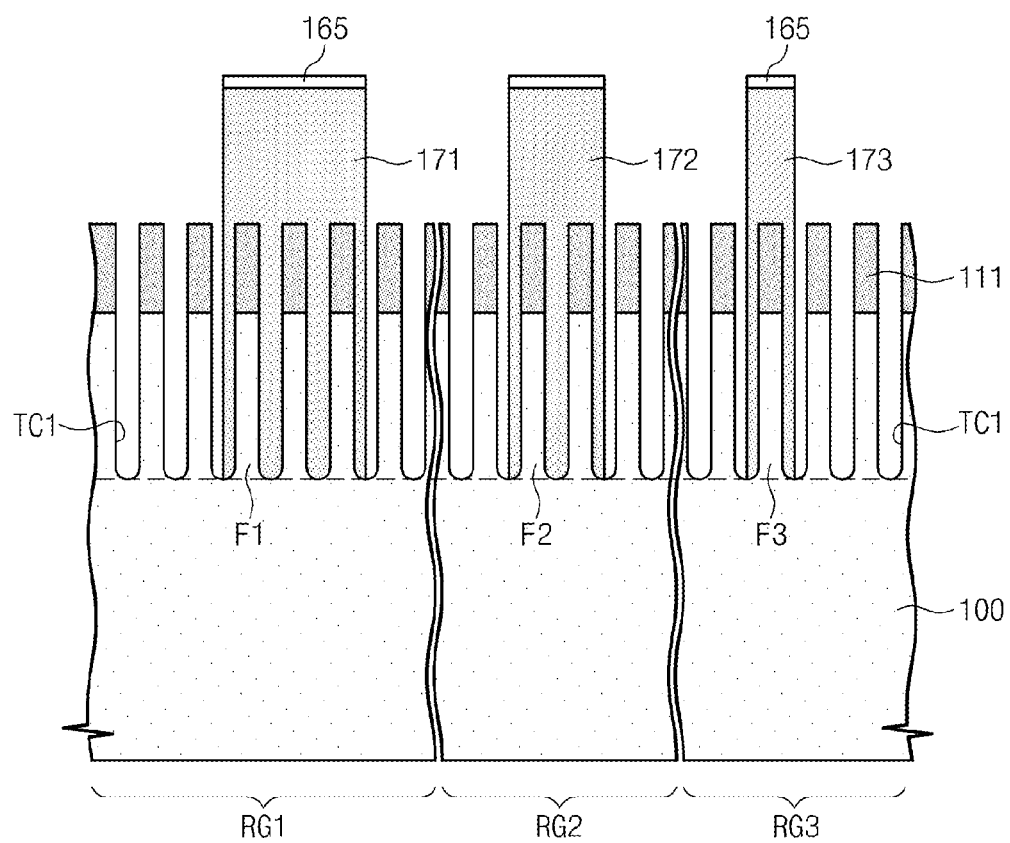

Referring to FIGS. 2 and 9, the fourth mask layer 165 and the block mask layer 170 may be patterned using the fifth mask patterns 161-163 as an etch mask. Accordingly, block mask patterns 171-173 may be formed to cover some of the fin portions F1-F3 (in S2). In other words, the block mask patterns 171-173 may be formed after the formation of the first to third fin portions F1-F3. The patterning process may be performed using a selective etching process. The first block mask pattern 171 may be formed on the first region RG1 to cover three ones of the first fin portions F1, the second block mask pattern 172 may be formed on the second region RG2 to cover two ones of the second fin portions F2, and the third block mask pattern 173 may be formed on the third region RG3 to cover one of the third fin portions F3. Thereafter, the fifth mask patterns 161-163 may be removed.

Figure 10:
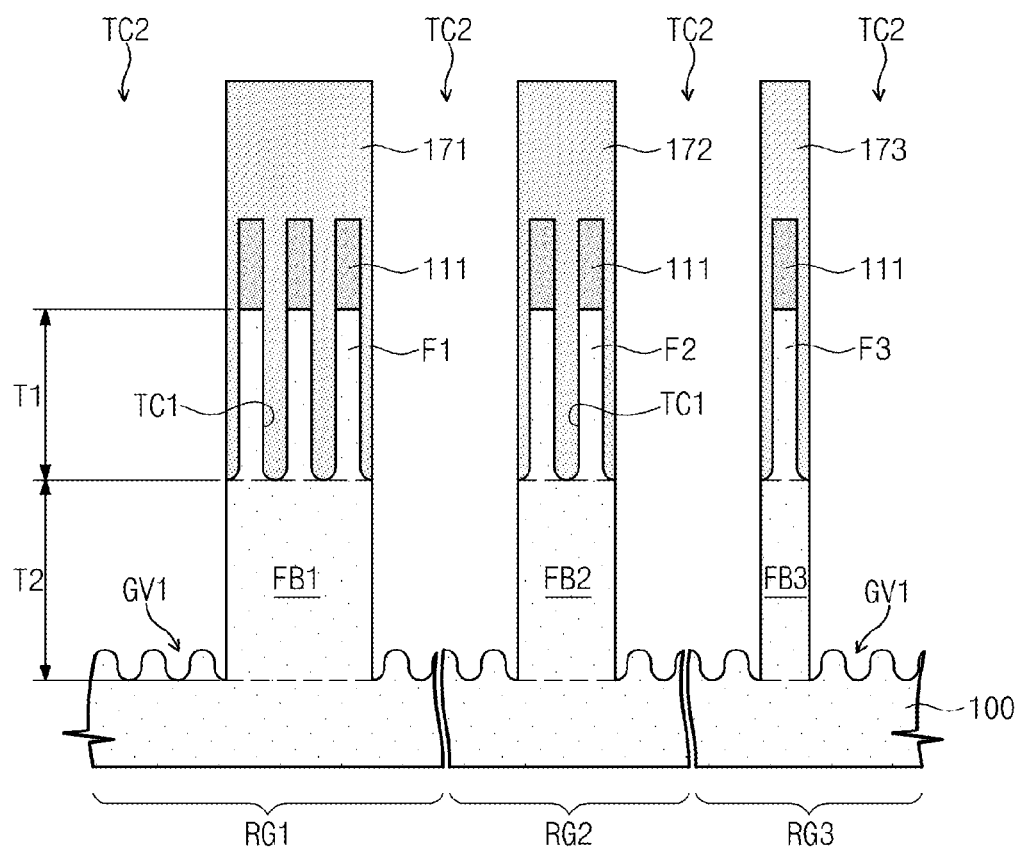

Referring to FIGS. 1, 2, and 10, the fin portions F1-F3 exposed by the block mask patterns 171-173 may be etched to form second trenches TC2 (in S3). The fourth mask layer 165 may be removed by the process of etching the fin portions F1-F3. Bottom surfaces of the second trenches TC2 may be formed to be lower by a depth T2 than those of the first trenches TC1. In the present example embodiments, the depth T2 between the bottom surfaces of the first and second trenches TC1 and TC2 may be greater than half the depth T1 of the first trenches TC1. As the result of the formation of the second trenches TC2, fin bases FB1-FB3 may be formed to protrude from the top surface of the substrate 100 and be connected to the plurality of the fin portions F1-F3. Hereinafter, the top surface of the substrate 100 will be used to refer to the bottom surfaces of the second trenches TC2. The fin bases FB1-FB3 may be delimited by the bottom surfaces of the first trenches TC1 and by the second trenches TC2. In the present example embodiments, the first fin base FB1 may be connected to three ones of the first fin portions F1, the second fin base FB2 may be connected to two ones of the second fin portions F2, and the third fin base FB3 may be connected to one of the third fin portions F3. Thicknesses of the fin bases FB1-FB3 may be given by a height difference between the bottom surfaces of the first and second trenches TC1 and TC2 (i.e., the depth T2). In the present example embodiments, the thickness T2 of the fin bases FB1-FB3 may be greater than half the depth of the first trench TC1.

The bottom surface of the second trenches TC2 or the top surface of the substrate 100 may include grooves GV1 having convex portions and concave portions. The grooves GV1 may be formed adjacent to the fin bases FB1-FB3. The concave and convex structure of the grooves GV1 may result from a profile of the fin portions F1-F3 exposed by the block mask patterns 171-173 shown in FIG. 9. For example, the convex portions may extend along the extending direction (i.e., y-axis direction of FIG. 2) of the fin portions F1-F3. A space between the convex portions may be substantially equal to or less than that between the fin portions F1-F3.

Figure 11:
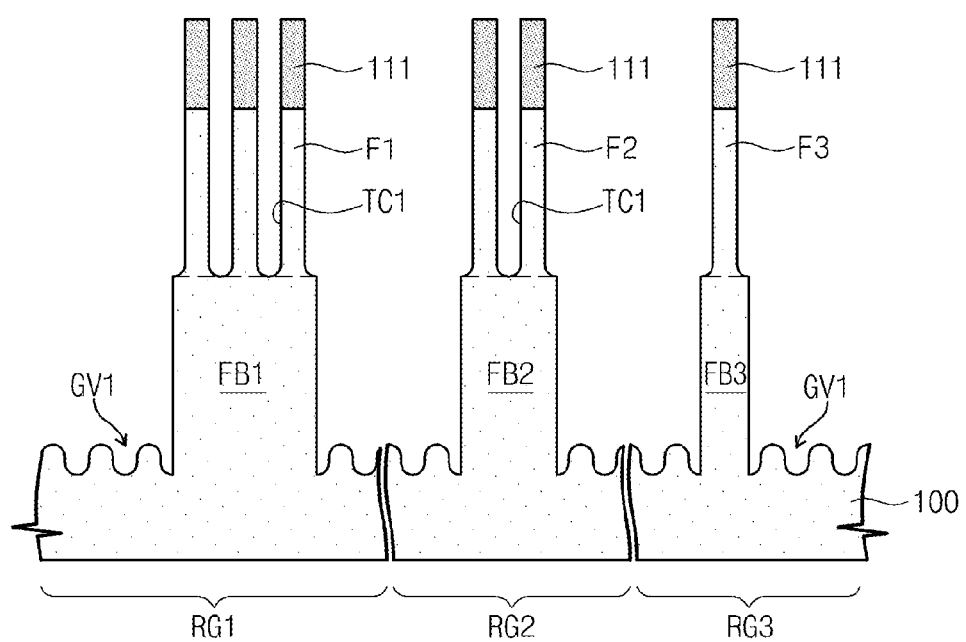
Figure 12:
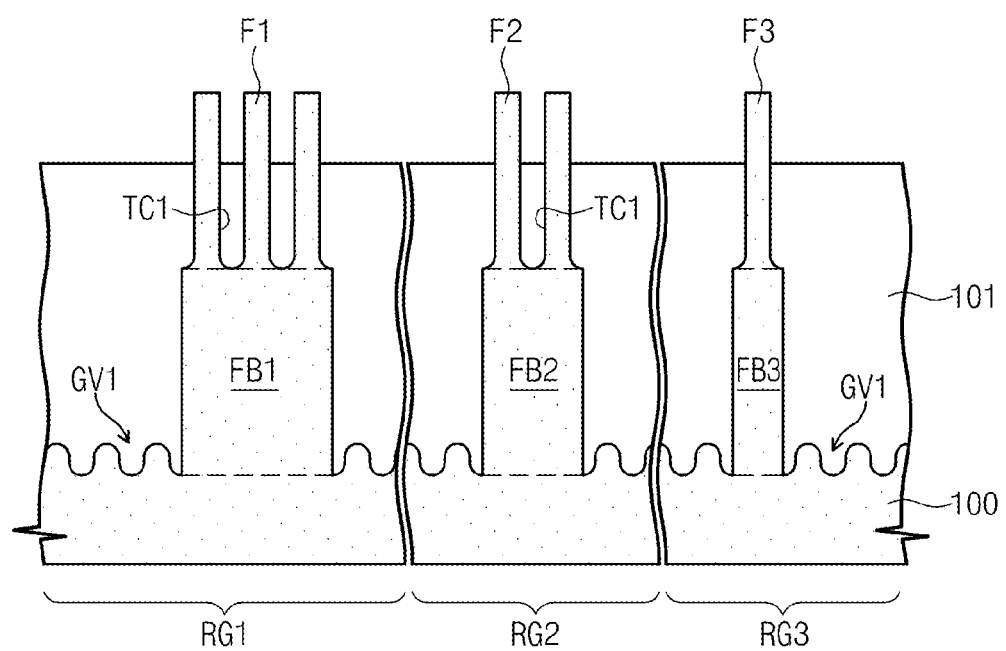

Referring to FIGS. 2, 11, and 12, the block mask patterns 171-173 may be removed. The plurality of fin portions F1-F3 and the first mask patterns 111 may be exposed by the removal process. The removal process may be performed using a selective etching process. Thereafter, the first mask patterns 111 may be removed. A device isolation layer 101 may be formed on the structure, in which the block mask patterns 171-173 and the first mask patterns 111 are removed. The device isolation layer 101 may expose upper portions of the fin portions F1-F3. For example, the device isolation layer 101 may be formed to partially fill the first trenches TC1. The device isolation layer 101 may be a high-density plasma oxide layer, spin-on-glass (SOG) layer, and/or a CVD oxide layer.

Figure 13:
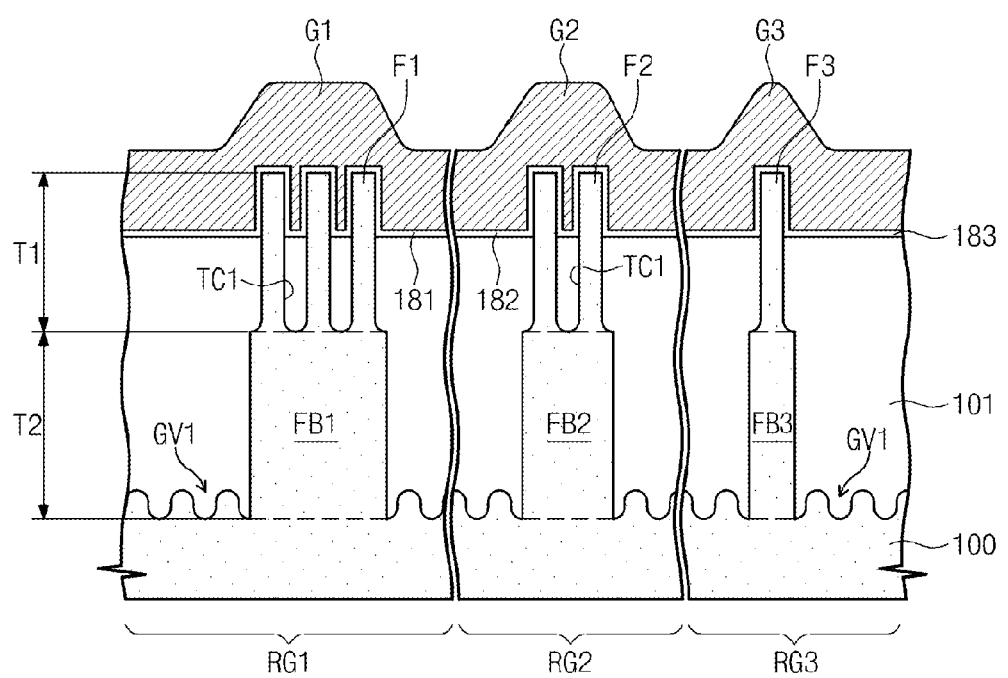

Referring to FIGS. 1, 2, and 13, gate dielectrics 181-183 and gate electrodes G1-G3 may be sequentially formed on the resultant structure provided with the device isolation layer 101 (in S4). The gate dielectrics 181-183 may be formed to cover surfaces of the fin portions F1-F3 exposed by the device isolation layer 101. The gate dielectrics 181-183 may include a silicon oxide layer or high-k dielectrics having a dielectric constant greater than that of the silicon oxide layer. For example, the gate dielectrics 181-183 may include $HfO_2$, $ZrO_2$ or $Ta_2O_5$. The gate electrodes G1-G3 may include at least one of doped semiconductor materials, metals, conductive metal nitrides, or metal-semiconductor compounds. For example, the gate electrodes G1-G3 may include a conductive metal nitride layer (e.g., TiN or TaN).

The first to third fin portions F1-F3 may have the substantially same width as each other.

Figure 14:
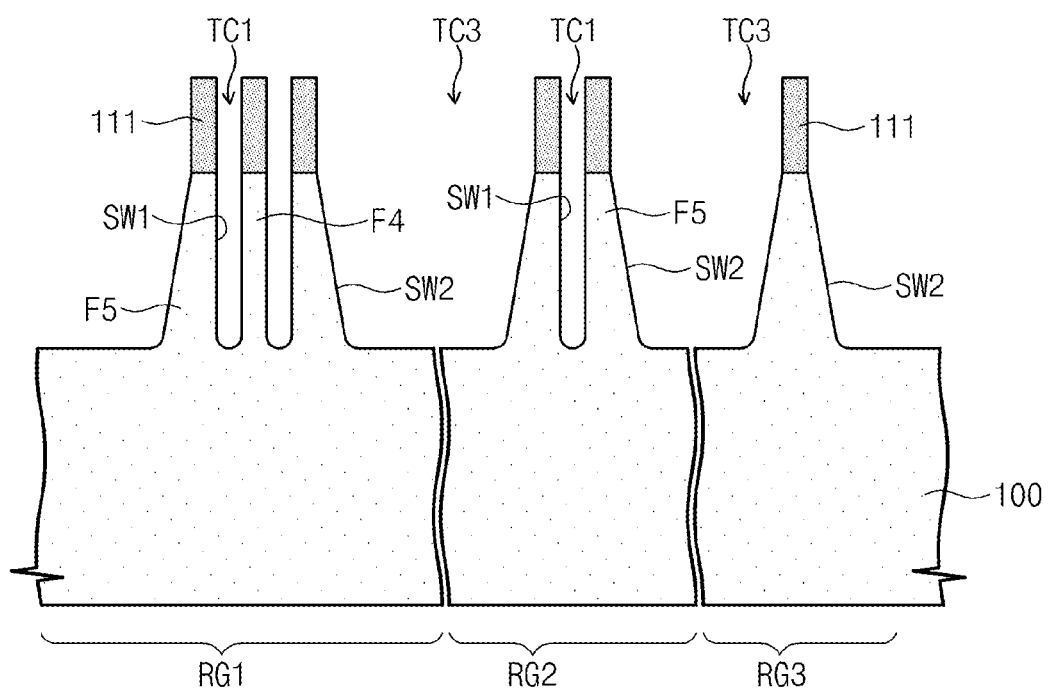
FIG. 14 is a diagram illustrating a method of fabricating a field effect transistor according to a comparative embodiment.

FIG. 14 is a diagram illustrating a method of fabricating a field effect transistor according to a comparative embodiment.

In the comparative embodiments, the fin portions may be formed by an etching process using the first mask patterns 111 as an etch mask. In this case, as shown in FIG. 14, third trenches TC3 between the first and second regions RG1 and RG2 and between the second and third regions RG2 and RG3 may have a width greater than the width of the first trench TC1. For example, the width of the third trench TC3 may be several ten times greater than that of the first trench TC1. Due to the difference in width between the trenches TC1 and TC3, sidewalls SW2 of the third trenches TC3 having relatively wide width may be formed at an angle to the top surface of the substrate 100, while sidewalls SW1 of the first trenches TC1 having relatively narrow width may be formed at a substantially right angle to the top surface of the substrate 100. This may result from that the etching gas (e.g., HBr or $Cl_2$) may be non-uniformly supplied into the first and third trenches TC1 and TC3 having different widths from each other. As a result, fifth fin portions F5 having a sidewall delimited by the third trench TC3 may have different widths from those of fourth fin portions F4 having both sidewalls delimited by the first trenches TC1. The difference in width between the fin portions may lead to an increase in distribution of threshold voltages or deterioration in electric characteristics of a multi-fin transistor having a plurality of fin portions.

According to example embodiments, as shown in FIG. 7, the fin portions may be formed to have the substantially same width, and then, some of them may be exposed over the device isolation layer. This enables to reduce the distribution of threshold voltages, which may be caused by the difference in width of the fin portions, and to suppress the deterioration in electric characteristics of the fin-FET.

A field effect transistor according to example embodiments will be described with reference to FIGS. 1, 2, and 13.

The substrate 100 may be provided to include the first to third regions RG1-RG3. Transistors provided on the first to third regions RG1-RG3 may have different threshold voltages from each other. The fin bases FB1-FB3 may be provided to protrude from the top surface of the substrate 100, and the fin portions F1-F3 may be provided to extend upward from the fin bases FB1-FB3. The fin portions F1-F3 may have the substantially same width in X direction. In example embodiments, a plurality of fins may be used to form a single transistor. For example, the first fin portions F1 may connect the first source region SR1 to the first drain region DR1, and the second fin portions F2 may connect the second source region SR2 to the second drain region DR2. However, the third fin portion F3 may be singly provided. The number of the fin portions provided on the first to third regions RG1-RG3 may be variously modified in consideration of several factors, such as use, size, and threshold voltage of the semiconductor device.

The source regions SR1-SR3 and the drain regions DR1-DR3 may be impurity regions having a different conductivity type from the substrate 100. For example, in the case where NMOS transistors are formed in the first to third regions RG1-RG3, the substrate 100 may include a p-type impurity region, and the source regions SR1-SR3 and the drain regions DR1-DR3 may be n-type impurity regions. In other example embodiments, at least one of the first to third regions RG1-RG3 may be an NMOS transistor region(s), and the remaining may be a PMOS transistor region.

The fin bases FB1-FB3 may extend upward from the top surface of the substrate 100 to the bottom surfaces of the first trenches TC1. Each of the first and second fin bases FB1 and FB2 may be connected to a plurality of the fin portions F1 and F2. For example, the first fin base FB1 may be connected to three ones of the first fin portions F1, and the second fin base FB2 may be connected to two ones of the second fin portions F2. Unlike this, the third fin base FB3 may be connected to one of the third fin portions F3. In example embodiments, the thickness T2 of the fin bases FB1-FB3 may be greater than half the depth T1 of the first trenches TC1. For example, the thickness T2 of the fin bases FB1-FB3 may range from about 700 Å to about 1500 Å, and the depth T1 of the first trenches TC1 may range from about 500 Å to about 1400 Å.

The top surface of the substrate 100 may include the grooves GV1 provided at both sides of each of the fin bases FB1-FB3 and defined by convex portions and concave portions. The convex portions of the grooves GV1 may extend along the extending direction of the fin portions F1-F3. The convex portions may have the width substantially equal to or less than the width of the fin portions F1-F3. For example, the height of the grooves GV1 may range from about 30 Å to about 300 Å. The convex portions of the grooves GV1 may have top surfaces lower than the bottom surfaces of the first trenches TC1.

The device isolation layer 101 may be formed to expose the upper portions of the fin portions F1-F3. The device isolation layer 101 may cover the grooves GV1 and fill the lower portions of the first trenches TC1. The gate electrodes G1-G3 may be provided on the fin portions F1-F3, and the gate dielectrics 181-183 may be provided between the gate electrodes G1-G3 and the fin portions F1-F3.

In example embodiments, the field effect transistor may be configured to include the fin portions, whose widths are substantially equal to each other.

Figure 15:
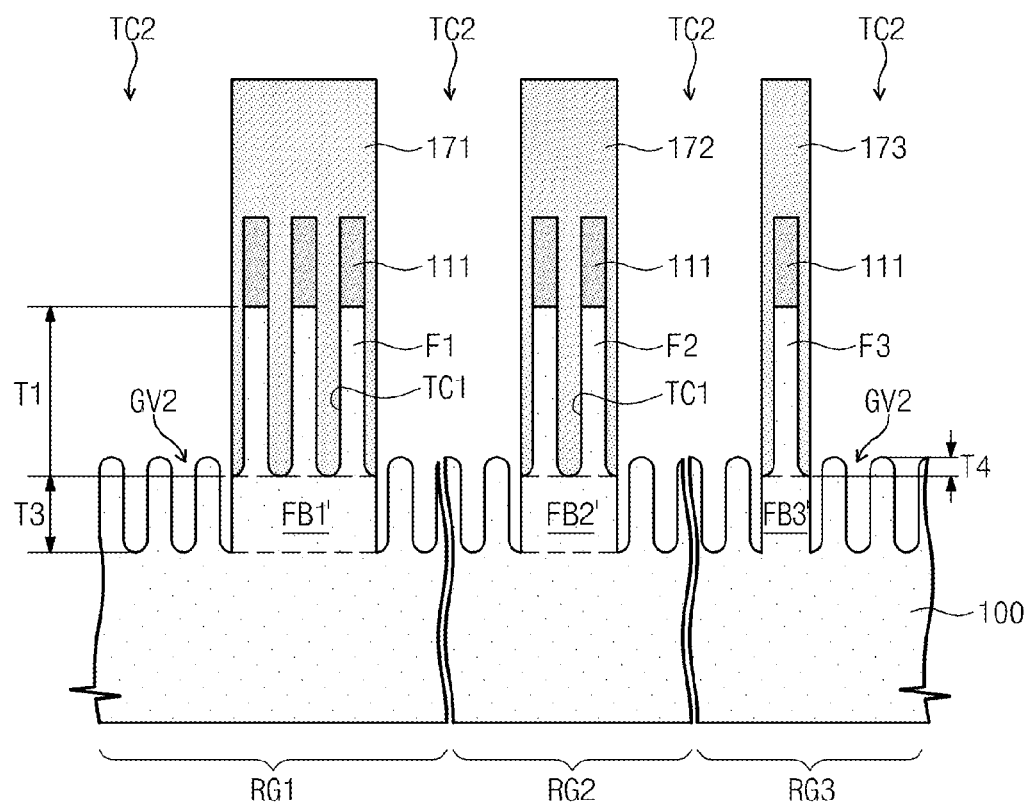
FIGS. 15 and 16 are sectional views taken along a line I-I' of FIG. 2 and show a method of fabricating a field effect transistor according to other example embodiments.
Figure 16:
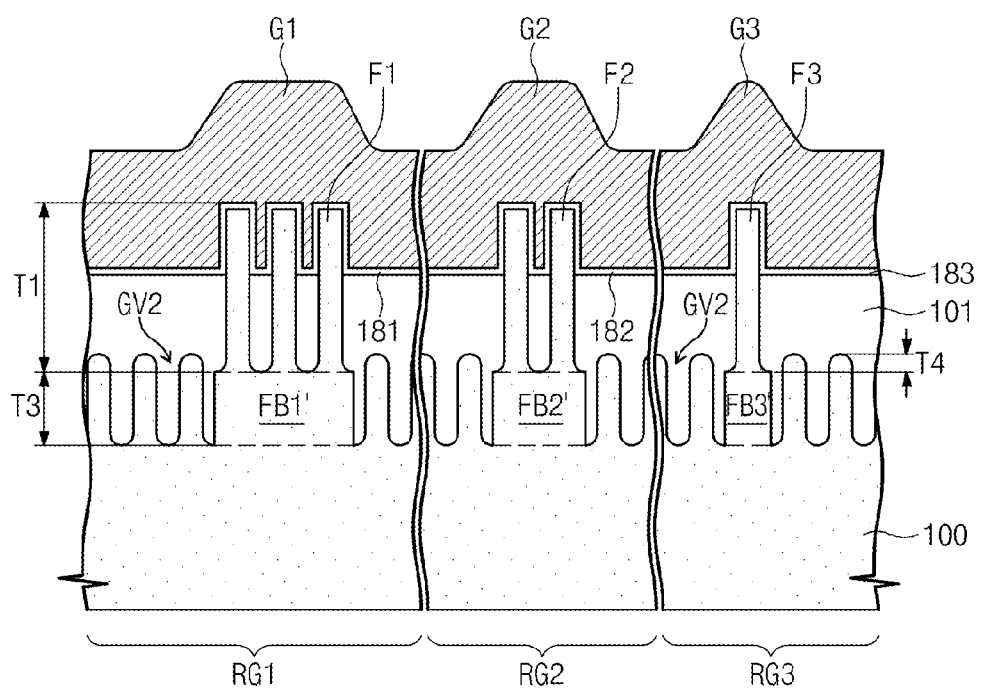

FIGS. 15 and 16 are sectional views taken along a line I-I' of FIG. 2 and show a method of fabricating a field effect transistor according to other example embodiments. For the sake of brevity, the elements and features of this example that are similar to those previously shown and described will not be described in much further detail.

Referring to FIGS. 2 and 15, the fin portions F1-F3 exposed by the block mask patterns 171-173 described with reference to FIG. 9 may be etched to form the second trenches TC2 around the block mask patterns 171-173. The fourth mask layer 165 may be removed during the etching process. The second trenches TC2 may be formed to have bottom surfaces lower by a distance T3 than the first trenches TC1. In the present example embodiments, the distance T3 between the bottom surfaces of the second trenches TC2 and the first trenches TC1 may be less than half the depth T1 of the first trenches TC1. As the result of the formation of the second trenches TC2, fin bases FB1'-FB3' may be formed to protrude upward from the top surface of the substrate 100 and connect the substrate 100 with the plurality of fin portions F1-F3. The thickness of the fin bases FB1'-FB3' may be equal to the distance T3 between the bottom surfaces of the first and second trenches TC1 and TC2. In example embodiments, the thickness T3 of the fin bases FB1'-FB3' may be less than half the depth T1 of the first trenches TC1. For example, the thickness T3 of the fin bases FB1'-FB3' may range from about 250 Å to about 700 Å, and the depth T1 of the first trenches TC1 may range from about 500 Å to about 1400 Å.

The bottom surface of the second trenches TC2 or the top surface of the substrate 100 may include grooves GV2 having convex portions and concave portions. The grooves GV2 may be formed adjacent to each of the fin bases FB1'-FB3'. The convex portions may extend along the extending direction (i.e., y-axis direction of FIG. 2) of the fin portions F1-F3. A space between the convex portions may be substantially equal to or greater than that between the fin portions F1-F3. The convex portions of the grooves GV2 may have top surfaces higher by a height T4 than the bottom surfaces of the first trenches TC1. For example, the height T4 may range from about 10 Å to about 200 Å. The thicknesses of the fin bases FB1'-FB3' and the heights of the grooves GV2 may be determined by an etching depth in the etching process to form the second trenches TC2.

Referring to FIGS. 2 and 16, the device isolation layer 101 may be formed after the removal of the block mask patterns 171-173. The device isolation layer 101 may be formed to expose the upper portions of the fin portions F1-F3. For example, the device isolation layer 101 may be formed to partially fill the first trenches TC1. The device isolation layer 101 may be a high-density plasma oxide layer, spin-on-glass (SOG) layer, and/or a CVD oxide layer. The gate dielectrics 181-183 and the gate electrodes G1-G3 may be sequentially formed on the resultant structure provided with the device isolation layer 101.

According to example embodiments, the fin portions may be formed to have the substantially same width, and this enables to reduce the distribution of threshold voltages and to suppress the deterioration in electric characteristics of the fin-FET.

Figure 17:
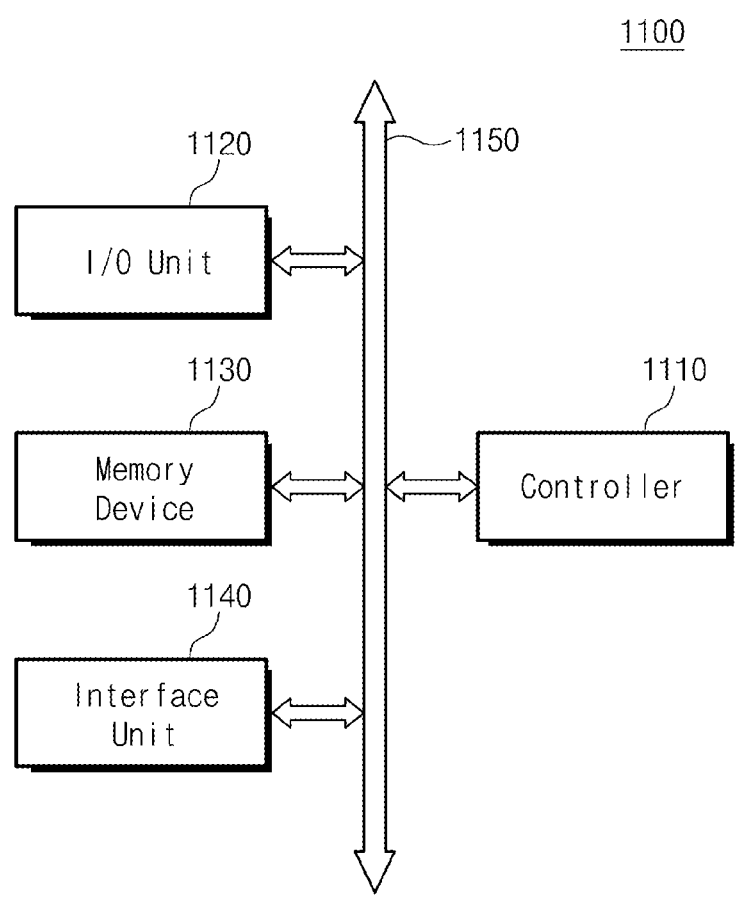
FIG. 17 is a block diagram of an electronic system including a fin field effect transistor according to example embodiments.

FIG. 17 is a block diagram of an electronic system including a fin field effect transistor according to example embodiments.

Referring to FIG. 17, an electronic system 1100 according to example embodiments may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The other logic device may have a similar function to any one of the microprocessor, the digital signal processor and the microcontroller. The I/O unit 1120 may include a keypad, a keyboard or a display unit. The memory device 1130 may store data and/or commands. The memory device 1130 may further include another type of data storing devices, which are different from the data storing devices described above. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110. The field effect transistor according to example embodiments may be provided in the memory device 1130 or serve as components of the controller 1110 and/or the I/O unit 1120.

The electronic system 1100 may be applied to a personal digital assistant (PDA), a portable computer, a web tablet, a wireless phone, a mobile phone, a digital music player, a memory card or an electronic product. The electronic product may receive or transmit information data by wireless.

According to example embodiments, it is possible to provide a field effect transistor with improved electric characteristics. In addition, the field effect transistor may include a plurality of fin portions, which are formed to have the substantially same width.

While example embodiments have been particularly shown and described, it will be understood by one of ordinary skill in the art that variations in form and detail may be made therein without departing from the spirit and scope of the attached claims.

What is claimed is:
1. A field effect transistor, comprising:
a source region and a drain region on a substrate;
a fin base protruding from a top surface of the substrate;
a plurality of fin portions extending upward from the fin base and connecting the source region with the drain region;
a gate electrode on the plurality of fin portions;
a gate dielectric between the plurality of fin portions and the gate electrode; and a device isolation layer exposing upper portions of the plurality of fin portions and covering the top surface of the substrate adjacent to the fin base, wherein the top surface of the substrate adjacent to the fin base includes a plurality of grooves, and each of the plurality of grooves includes a plurality of convex portions and a plurality of concave portions extending along an extending direction of the plurality of fin portions.

2. The field effect transistor of claim 1, wherein a thickness of the fin base is greater than half a depth of a first trench between the plurality of fin portions.

3. The field effect transistor of claim 1, further comprising:
at least one first trench between the plurality of fin portions,
wherein top surfaces of the plurality of convex portions are lower than a bottom surface of the at least one first trench.

4. The field effect transistor of claim 1, further comprising:
at least one first trench between the plurality of fin portions,
wherein top surfaces of the plurality of convex portions are higher than a bottom surface of the at least one first trench.

5. The field effect transistor of claim 1, further comprising:
at least one first trench between the plurality of fin portions,
wherein a top surface of the device isolation layer is higher than a bottom surface of the at least one first trench.

6. The field effect transistor of claim 1, wherein a distance between the plurality of convex portions is substantially equal to a distance between the plurality of fin portions.

7. The field effect transistor of claim 1, wherein the plurality of convex portions and the plurality of concave portions alternate each other assimilating a line-and-space pattern of the plurality of fin portions.

8. The field effect transistor of claim 1, wherein the plurality of fin portions include a first fin portion and second fin portions, the second fin portions being outside the first fin portion and adjacent to the plurality of grooves, and the first and second fin portions have a substantially same width.

9. A field effect transistor, comprising:
at least one fin portion extending from a top surface of a substrate;
a device isolation layer exposing an upper portion of the at least one fin portion;
a gate electrode on and crossing the at least one fin portion; and
a gate dielectric between the at least one fin portion and the gate electrode,
wherein the top surface of the substrate includes a plurality of grooves, each of the plurality of grooves includes a plurality of convex portions and a plurality of concave portions, the plurality of convex portions extend parallel to the at least one fin portion, and the device isolation layer covers top surfaces of the plurality of convex portions.

10. The field effect transistor of claim 9, wherein the at least one fin portion includes a plurality of fin portions spaced apart from, each other by at least one first trench therebetween, and further comprising:
a fin base extending from the top surface of the substrate and connected to bottom surfaces of the plurality of the fin portions.

11. The field effect transistor of claim 10, wherein a top surface of the fin base is defined by a bottom surface of the at least one first trench, and
the bottom surface of the at least one first trench is higher than top surfaces of the plurality of convex portions.

12. The field effect transistor of claim 10, wherein a top surface of the fin base is defined by a bottom surface of the at least one first trench, and
the bottom surface of the at least one first trench is lower than top surfaces of the plurality of convex portions.

13. The field effect transistor of claim 10, wherein the plurality of the fin portions connect a source region with a drain region, and
upper portions of the plurality of the fin portions have a substantially same width as each other.

14. The field effect transistor of claim 9, wherein the substrate includes a first region and a second region, and
a number of the at least one fin portion in the first region is different than a number of the at least one fin portion in the second region.

15. A field effect transistor, comprising:
a substrate having a substrate body, at least one fin portion extending away from a surface of the substrate body, and a fin base interposed between the substrate body and the at least one fin portion;
a source region and a drain region connected to each other via the at least one fin portion;
a gate electrode over the at least one fin portion;
a gate dielectric between the at least one fin portion and the gate electrode; and
a device isolation layer exposing an upper portion of the at least one fin portion and covering a top surface of the substrate body adjacent to the fin base,
wherein the top surface of the substrate body adjacent to the fin body includes a plurality of grooves, each of the plurality of grooves includes a plurality of convex portions and a plurality of concave portions, and the plurality of convex portions extend from the surface of the substrate body and are parallel to the at least one fin portion.

16. The field effect transistor of claim 15, wherein the at least one fin portion includes a plurality of fin portions having a same width and spaced apart from each other.

17. The field effect transistor of claim 16, wherein the plurality of fin portions are symmetrical.

18. The field effect transistor of claim 16, wherein,
either the plurality of grooves extends above the fin base or the fin base extends above the plurality of grooves.

19. The field effect transistor of claim 18, wherein a thickness of the fin base is less than half a depth of a first trench between adjacent fin portions when the plurality of grooves extend above the fin base, or the thickness of the fin base is greater than half the depth of the first trench when the fin base extends above the plurality of grooves.

* * * * *

UNITED STATES PATENT AND TRADEMARK OFFICE
CERTIFICATE OF CORRECTION

PATENT NO. : 8,987,836 B2  
APPLICATION NO. : 13/780855  
DATED : March 24, 2015  
INVENTOR(S) : Myeong-cheol Kim et al.

Page 1 of 1

It is certified that error appears in the above-identified patent and that said Letters Patent is hereby corrected as shown below:

Title Page, Item (54) and in the Specification, at Column 1, lines 1-3, the correct title of the invention should read FIELD EFFECT TRANSISTOR HAVING FIN BASE AND AT LEAST ONE FIN PROTRUDING FROM FIN BASE Signed and Sealed this  
Fifth Day of April, 2016

Michelle K. Lee  
*Director of the United States Patent and Trademark Office*